United States Patent [19]

Abe et al.

[11] 4,422,547

[45] Dec. 27, 1983

[54] CONTAINER FOR HOLDING SUBSTRATE

[75] Inventors: Nobutoshi Abe, Kawasaki; Yukio Kakizaki, Yokohama; Jiro Kobayashi, Yamato, all of Japan

[73] Assignee: Nippon Kogaku K.K., Tokyo, Japan

[21] Appl. No.: 445,030

[22] Filed: Nov. 29, 1982

[51] Int. Cl.³ .................... B65D 85/30; B65D 81/02; H01N 13/54
[52] U.S. Cl. ................................ 206/328; 206/334; 206/454; 206/565; 312/61
[58] Field of Search ............... 206/334, 328, 454, 565; 312/61, 71; 220/329

[56] References Cited

U.S. PATENT DOCUMENTS

| | | | |
|---|---|---|---|
| 2,275,373 | 3/1942 | Barrett | 206/565 |
| 3,353,656 | 11/1967 | Brown | 206/328 |
| 3,383,507 | 5/1968 | Brackett et al. | 206/454 |
| 3,615,006 | 10/1971 | Freed | 206/328 |

Primary Examiner—William T. Dixson, Jr.
Attorney, Agent, or Firm—Fitzpatrick, Cella, Harper & Scinto

[57] ABSTRACT

A container for a piece of substrate such as reticle, mask or wafer is disclosed. The container comprises a housing body having an opening for receiving a substrate, a door for closing and opening said opening of the housing body and means for fixing the received substrate to the container. Said fixing means includes a contact member movable to fix the substrate in the position and a member for moving the contact member in link with the motion of the door.

5 Claims, 10 Drawing Figures

CONTAINER FOR HOLDING SUBSTRATE

BACKGROUND OF THE INVENTION

The present invention relates to a container for holding a substrate such as a reticle, mask or wafer for use in the manufacture of semiconductor devices such as IC, LSI and VLSI.

The container for holding such a substrate should be designed in such manner as to be closed tightly against dust and also to allow the substrate to be taken out from the container at once when necessary. Further, it is desired that the substrate be fixed immovable in the container to prevent the substrate from being damaged during the transportation of the container.

SUMMARY OF THE INVENTION

Accordingly, it is an object of the invention to provide a container which is well adapted for holding such a substrate as a reticle, mask or wafer.

It is another object of the invention to provide a container which can keep the substrate in a tightly closed space completely isolated from the exterior, and also can lock the substrate immovably within the container.

It is a further object of the invention to provide a container which can hold the substrate locked in the position within the tightly closed space and which can easily release the lock when the substrate is brought into the container or taken out from it.

Other and further objects, features and advantages of the invention will appear more fully from reading the following description taken in connection with the accompanying drawings.

DESCRIPTION OF PREFERRED EMBODIMENTS

Figure 1:
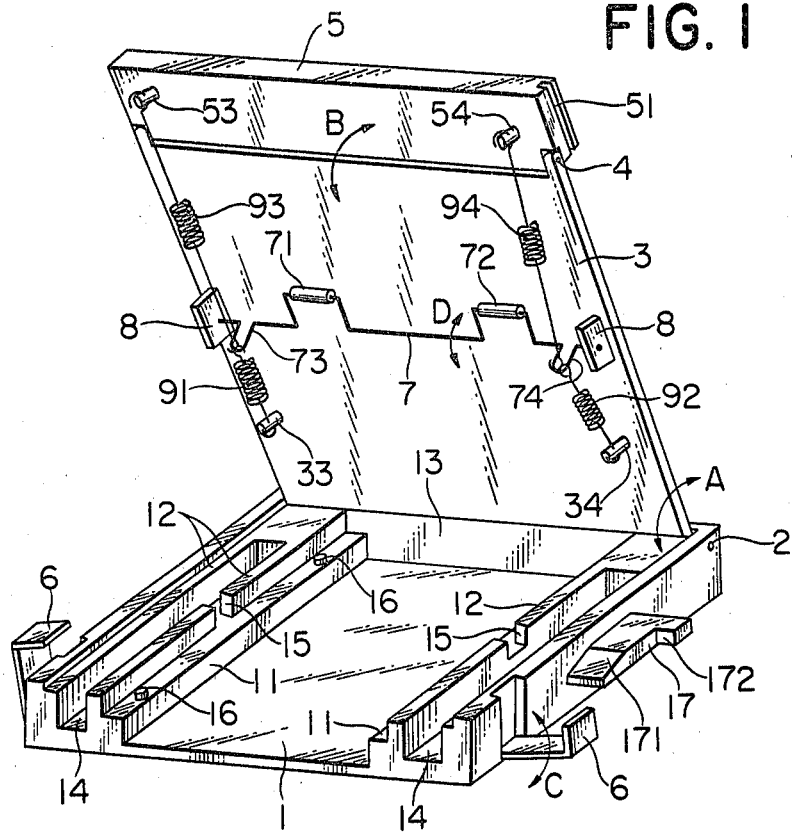
FIG. 1 is a perspective view of a substrate container according to an embodiment of the invention.

Referring first to FIG. 1 there is shown an embodiment of a substrate container according to the invention.

The container essentially comprises a box-like main body 1, a lid member 3 and a door member 5. The main body 1 has two side walls and a rear wall 13 to define a space for receiving a piece of substrate. The front side of the box-like main body 1 is left open. Each of the side walls is stepped twice to form a lower step portion 11 and a higher step portion 12. When a piece of substrate is inserted into the container, both side edges of the substrate are supported on the lower step portions 11. The height of the higher step portions 12 is so measured as to be slightly larger than the thickness of the inserted substrate.

The lid member 3 is connected to the side walls by means of hinge 2 so that the lid can pivotally move up and down about the hinge 2 as indicated by the double arrow A. When the lid member 3 is swung down about the hinge 2 and laid on the higher step portions 12, the open top side of the main body 1 is perfectly closed. The door member 5 is connected to the front edge of the lid member 3 by means of hinge 4 so that the door member 5 is pivotally movable about the hinge 4. The open front side of the main body 1 is closed by the door 5. Even after the lid member 3 has been closed, the door member 5 can be opened and closed at will to bring a piece of substrate into the container or take out it from the container through the front opening of the container. To accommodate the door member 5 for opening and closing, a groove 51 is provided on the side surface of the door member 5.

The box-like main body 1 has a pair of L-shaped locking members 6 provided on the side surfaces to lock the lid member 4 in the closed position. The locking members 6 are normally biased toward the position to lock the lid member on the main body 1 by means of a bias spring not shown. The locking member 6 can be rotated as indicated by the arrow C.

On the backside surface of the lid member 3 there are provided a pair of bearings 8 for supporting a pressing member 7 for rotation in the direction of arrow D. The pressing member 7 is formed of a wire such as piano wire. The wire is bent several times to form a pair of projecting portions 71 and 72 and another pair of projecting portions 73 and 74. The direction in which the projecting portions 71, 72 project and the direction in which the projecting portions 73, 74 project form right angles to each other. The projecting portions 71 and 72 are coated with a synthetic resin layer. The other projecting portions 73 and 74 function to give the pressing member 7 a turning force as will be described hereinafter.

The projecting portion 73 is pulled by springs 91 and 93 and the projecting portion 74 is pulled by springs 92 and 94. As shown in FIG. 1, the tension spring 91 extends between a stud pin 33 on the lid member and the projecting portion 73 whereas the spring 93 extends between the projecting portion 73 and a stud pin 53 on the door member 5. Similarly, the tension spring 92 extends between a stud pin 34 on the lid member 3 and the projecting portion 74 whereas the spring 94 extends between the projecting portion 74 and a stud pin 54 on the door member 5. The springs 91 and 92 have the same shape and biasing force and the springs 93 and 94 have the same shape and biasing force. The spring constants and the manner of connection of the springs with the projecting portions 73, 74 are so selected that when the door member 5 is flush with the lid member 3, the biasing force of the springs 93, 94 is larger than that of the springs 91, 92 but when the door member 5 is turned down about 90° relative to the lid member 3, the relationship in biasing force between the springs 93, 94 and 91, 92 is reversed.

At the higher step portions 12 of the both side walls of the main body 1 there are provided recessed portions 14 and 15 to receive the above elements 7, 8, 33, 34, 53, 54 and 91 to 94 when the lid member 3 is closed. Further, the main body 1 has guide members 17 fixed on the outer surface of the both side walls. The guide members 17 have each a tapered surface 172 and a projection 172. The function of the guide members 17 will be described in detail later. On each lower step portion 11 there are provided a pair of short projections 16 to prevent the slide movement of substrate on the step 11. The distance between two projections 16 and 16 is determined according to the size of the substrate to be contained in the container. The position of the projecting portions 71, 72 of the pressing member 7 is so selected that the projecting portions 71 and 72 may come into contact with the marginal blank portions of a pattern bearing substrate such as a reticle. In the above embodiment, the pressing member 7 has been shown to comprise two sets of springs 91, 93 and 92, 94. However, if the pressing member 7 is formed of material having higher rigidity, then the aimed object may be attained by only one set of springs.

A piece of substrate such as a reticle or mask is brought into the container in the following manner:

Initially, the lid member 3 is opened as shown in FIG. 1. The substrate is then placed on the step portions 11 with the both ends of the substrate being stopped by the projections 16 formed on the steps 11. Thereafter, the lid member 3 is closed on the main body 1. The lid member 3 is locked in the closed position by the locking members 6 at the both side walls of the main body 1. Since the lid member 3 of the container can be opened and closed at will, the work to put the substrate into the container and take it out of the container can be done manually and very easily.

Figure 2A:
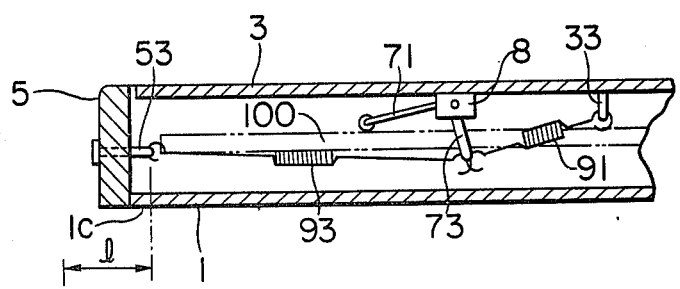
FIGS. 2A and 2B are partial sectional views of the container shown in FIG. 1 illustrating the operation thereof with its lid member closed.

FIG. 2A shows the container with the lid member 3 and the door member 5 closed after the insertion of a piece of substrate 100. As previously noted, when the door member 5 is closed, the tension force of the spring 91 becomes larger than that of the spring 93. Consequently, the pressing member 7 is turned about its axis and the projecting portion 73 of the pressing member is biased in the direction toward the stud pin 33. This biasing force intends to rotate the projecting portion 71 counter-clockwise. Therefore, the projecting portion 71 coated with a synthetic resin layer presses the substrate 100 against the surface of the step portion 11 as illustrated in FIG. 2A. In this position, the spring 93 has some effective biasing force to press the door member 5 against the open end of the main body 1.

Figure 2B:
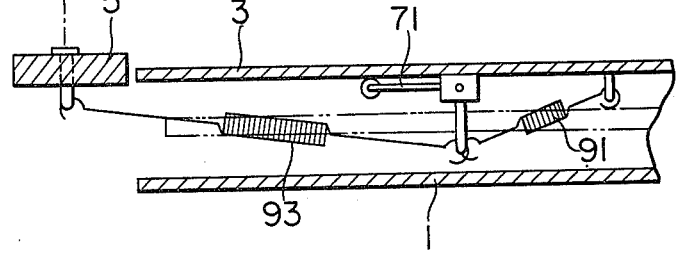

When the door member 5 is opened as shown in FIG. 2B, the connection point of the spring 93 with the stud pin 53 is moved over a distance l. Thereby, the one end of the spring 93 is pulled by the stud pin 53 thereby increasing the biasing force thereof. Before the door member 5 has reached its fully opened position shown in FIG. 2B, therefore, the relation in biasing force between the springs 91 and 93 is reversed. Thus, the biasing force of the spring 93 becomes larger than that of the spring 91. At that time point, the pressing member 7 rotates about its axis and the projecting portion 71 departs from the surface of the substrate 100. In the opened position shown in FIG. 2B in which the door member 5 is substantially flush with the lid member 3, the biasing force of the spring 93 which is larger than that of the spring 91 intends to rotate the projecting portion 71 clockwise. Therefore, in this opened position of the door member, the projecting portion 71 of the pressing member 7 is pressed against the backside surface of the lid member 3.

It is recommendable that the springs 91–94 be made not of metal but synthetic resin such as polyacetal. The reason for this is that if the springs 91–94 are metallic coil springs, there is the possibility that metal dust may be produced by the friction between metal and metal at their connection points when the door member 5 is closed and opened. Such metal dust may damage the surface of the substrate in the container. Therefore, it is preferable to use a synthetic resin such as polyacetal. In this case, the resin must be wrought up to particular forms having the necessary biasing forces for the above-mentioned springs 91 to 94.

Figure 3:
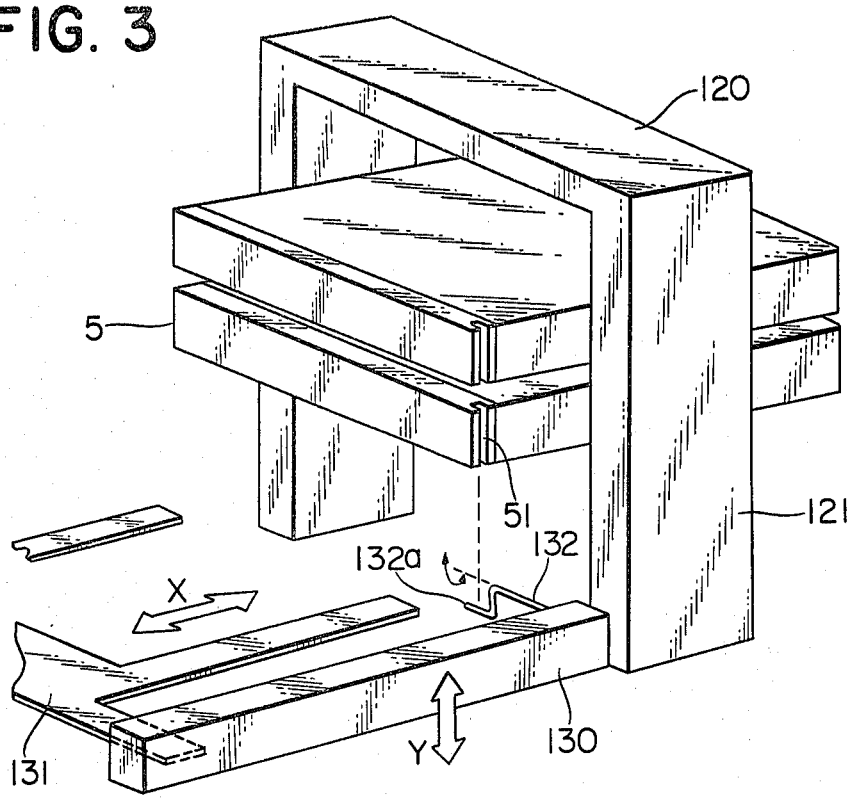
FIG. 3 is a perspective view of an embodiment of a holder used to hold a stack of substrate containers as shown in FIG. 1.

FIG. 3 shows an embodiment of a container holder for holding a stack of the above shown containers.

The holder 120 shown in FIG. 3 has a pair of upright supports 121. Containers are inserted into the space between the supports 121 and 121 one on another with the door members 5 of the respective containers being in alignment with each other. To position and support the individual containers in the holder, the above-mentioned guide members 17 provided on both sides of the main body 1 (FIG. 1) are used in the manner later described.

The holder 120 is provided with a substrate carrier 131 in the form of a fork and a moving member 130 having a door opener 132 integrally formed with the moving member. The moving member 130 can be moved vertically along the support 121 in the direction of arrow Y. The substrate carrier 131 can be moved horizontally in the direction of arrow X by a horizontally driving mechanism (not shown) mounted in the moving member 130. The door opener 132 normally takes a position in which the bent free end 132a is down. When the moving member 130 is moved vertically, the free end 132a of the opener 132 is moved passing through the grooves 51 of the door members 5 of the containers aligned vertically in the holder. When the opener 132 is driven to rotate about 90 degrees about its axis by a driving source not shown, the free end 132a opens one of the doors 5 through the engagement with its groove 51.

To take out the substrate from any desired one of the containers in the holder 120, the moving member 130 is at first moved to the position in which the substrate carrier 131 is just opposed to the door 5 of the desired container. In this position, the opener 132 is rotated to turn the door member 5 up to the opened position shown in FIG. 2B. After opening the door 5 in this manner, the substrate carrier 131 is moved into the container. Thus, the fork-shaped carrier 131 is inserted into the space between the substrate 100 and the bottom wall of the container body 1. When the carrier reaches the position directly under the substrate 100, the moving member 130 is moved a little further upwards. By this upward movement, the substrate 100 is transferred onto the carrier 131 from the lower step portion 11 of the main body 1 of the container. At this time, the backside surface of the substrate 100 is raised up to the level slightly above the stopper projections 16 on the step portion 11. The fork-shaped carrier 131 now carrying the substrate 100 thereon is then moved back horizontally out of the container. In this manner, the substrate 100 is taken out from the desired container.

The substrate 100 taken out from the container in the manner described above is then transferred to a loader by which the substrate is transported to an exposure apparatus for manufacturing IC or other semiconductor devices, or to an examination apparatus for checking the substrate for any dust and/or scratches. When dust or any foreign particle is detected on the substrate, the latter has to be sent out at once to a cleaning station or to be replaced by a spare substrate. In this case, the defective substrate is returned to the container by operating the apparatus in the same manner as above but in the reversed direction to the above. After returning the substrate back into the container, the latter may be taken out from the holder 120.

Figure 4:
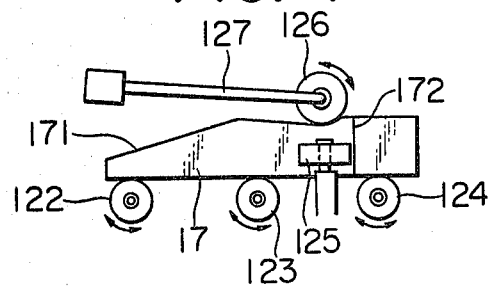
FIG. 4 is a side view showing the guide member of the container.

FIG. 4 shows an embodiment of a guide-and-support mechanism provided in the holder 120 for containers.

In FIG. 4, 122, 123 and 124 are rollers mounted on the inside wall surface the support 121 of the holder 120. These rollers are positioned to support the underside surface of the guide member 17 provided on the outer surface of the side wall of the main body 1 of the container (see FIG. 1). 125 is also a roller which is so positioned as to contact with the side surface of the guide member 17 of the container. When the container is inserted into the holder 120, the roller 125 rolls over the side surface of the guide member 17 and finally abuts against the side projection 172 to stop the container. Thus, the roller 125 serves as positioning means for the container inserted into the holder 120. A further roller 126 is so positioned as to contact the upper surface of the guide member 17. The roller 126 is mounted on the support 121 through an elastic member 127 which biases the roller 126 against the guide member 17 to apply pressure to the guide member.

When any one of the containers is to be taken out from the holder shown in FIG. 3, it can be done easily by drawing out the container backwardly from the holder 120 while sliding the guide member 17 along the above rollers 122–126 to the right as viewed in FIG. 4.

When a piece of substrate 100 is brought into the container or taken out from it by the substrate carrier 131 shown above, it is required to insert the carrier 131 between the substrate 100 and the bottom of the container body 1 without fail.

Figure 5:
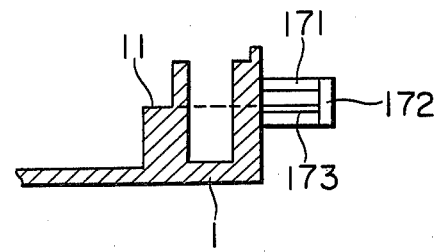
FIG. 5 is a front view showing an embodiment of detection means for detecting the position for insertion of a substrate into the container.

An embodiment of means for ensuring the errorless insertion of the substrate carrier 131 is shown in FIG. 5.

In FIG. 5, 173 is a horizontal slot formed on the front end of the guide member 17 of the container. The slot 173 is at the same level as the lower step 11 in the container. To detect the slot 173 a photo-electric detector is provided on the above-described moving member 130 of the holder. The photo-electric detector is a reflection type photo coupler which emits a beam of light and photo-electrically detects the light reflected from an object. The detector is provided on the moving member 130 as an integral part thereof. A photo coupler having a relatively short depth of focus is preferred. The photo coupler is so disposed as to detect the slot 173 when the substrate carrier 131 reaches the level between the substrate 100 and the bottom surface of the container body 1. Before inserting the carrier 131 into the container, the moving member 130 is vertically moved a little to make the photo coupler detect the slot 173. When the emitted light from the photo coupler passes through the slot and the photo coupler receives no reflected light from the guide member 17, it forms a detection signal of the slot. At this time point, the moving member 130 is stopped, and then the carrier 131 is inserted into the container. As the level of the carrier has been previously adjusted correctly in the manner described above, the carrier can be inserted into the space just under the substrate 100 without fail.

Figure 6:
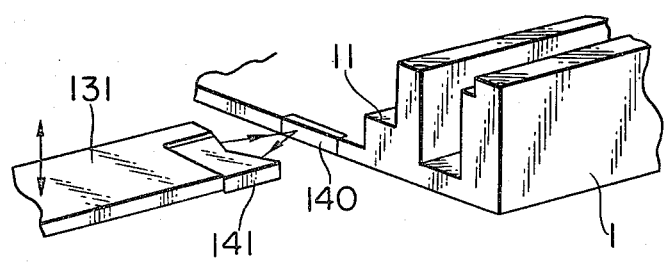
FIG. 6 is a perspective view showing another embodiment of detection means.

FIG. 6 shows another embodiment of detection means.

In this embodiment, a reflection member of high reflection factor designated by 140 is provided at the open front end of the container. On the other hand, a reflection type photo coupler 141 is provided at the leading end of the substrate carrier 131. Also, with this embodiment, the position for the insertion of the carrier 131 can be detected accurately.

Figure 7:
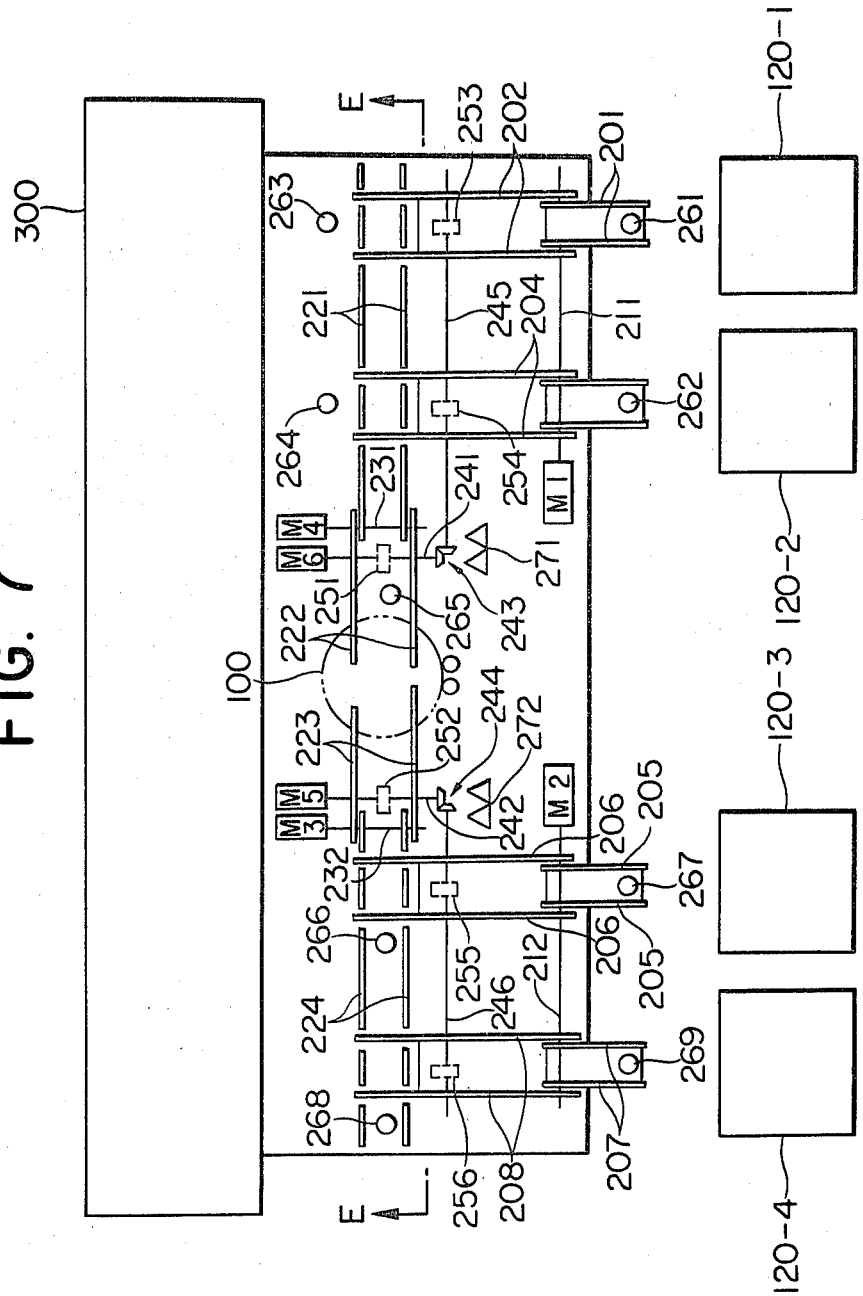
FIG. 7 is a plan view of a wafer conveyor system in which the substrate containers and holders according to the invention are used.

FIG. 7 shows a wafer conveying system used in combination with the substrate holders described above.

In FIG. 7, 120-1, 120-2, 120-3 and 120-4 are holders of the same structure as shown in FIG. 3. Each holder holds therein a stack of containers as described above. In this embodiment, the substrate contained in the container is a semiconductor wafer. Of four holders shown in FIG. 7 two holders 120-1 and 120-2 are holders for wafer supply and 120-3 and 120-4 are holders for wafer reception. Arranged opposed to the holders are conveyor belts 201–208.

The conveyor belts 201 to 204 are driven by a first motor M1 and the conveyor belts 205 to 208 by a second motor M2. Belts 202, 204 are mounted for swing movement about the driving shaft 211 and belts 206, 208 are mounted for swing movement about the driving shaft 212. A second set of conveyor belts 221–224 are arranged in a line orthogonal to the above belts 201–208. In the second group, the belts 221 and 222 are driven by a motor M4. Belts 223 and 224 are driven by a motor M3. The belts 222 and 223 are mounted for swing movement about the driving axes 231 and 232 respectively.

M5 and M6 are motors the rotation of which are transmitted to driving shafts 245 and 246 through driving shafts 241 and 242 and gears 243 and 244 respectively. Cams 251 and 252 are fixedly mounted on the driving shafts 241 and 242 to cause the conveyor belts 222 and 223 to swing up and down. Similarly, cams 253–256 are mounted on the driving shafts 245 and 246 to cause the swing motion of belts 202, 204, 206 and 208 respectively.

261–269 are sensors for detecting the presence of a wafer on the belt. In the embodiment, transmission or reflection type photo couplers are used as the wafer sensors.

271 and 272 are switches for detecting the rotational position (phase of rotation) of the gears 243 and 244 respectively. By detecting the phase of rotation of the gears the switches 271 and 272 detect the position of up-down of the related belts. The belts 202, 204, 206 and 208 in the first belt group are swing-moved between up-position and down-position in the same phase. The belts 222 and 223 in the second group are swing-moved between up-position and down-position in the same phase to each other. But, the phase of the swing motion of the belts in the second group is in opposition to the phases of swing motion of the belts in the first group. Cam surfaces of the above-mentioned cams are preset in such manner as to establish the above relationship in phase of swing motion between the belts.

Figure 8A:
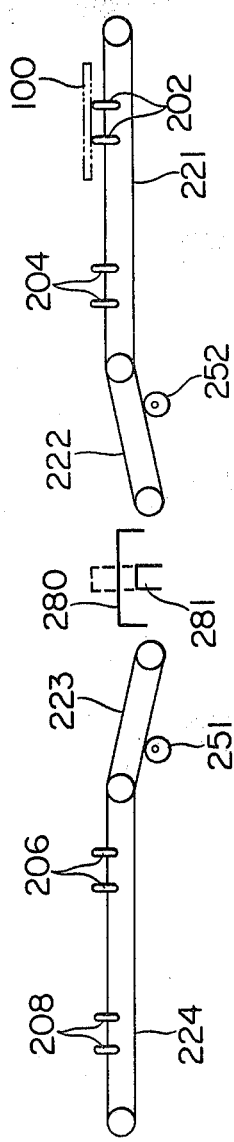
FIGS. 8A and 8B are views looking the conveyor system in the direction of arrow E—E in FIG. 7 illustrating the manner of operation of the system.
Figure 8B:
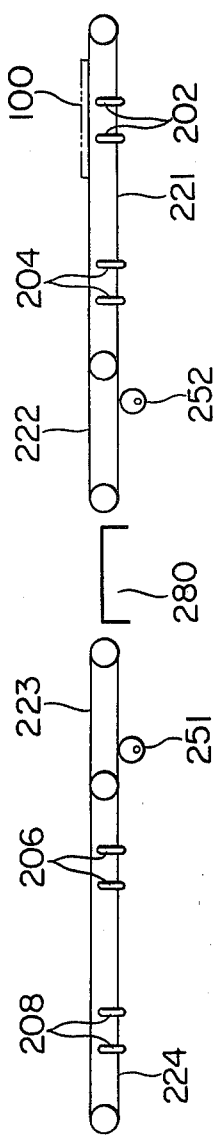

The manner of operation of the wafer conveying system shown in FIG. 7 will hereinunder be described with reference to FIGS. 8A and 8B.

The wafer supply holders 120-1, 120-2 and the wafer receiving holders 120-3, 120-4 are set in the positions shown in FIG. 7. To initially position the first and second belt groups, the phases of the swing belts in the two groups are at first detected by the switches 271 and 272. Based on the signals from the switches, the motors M5 and M6 are controlled to bring the belts to their starting positions. The starting position for the swing belts of the first group is the up-position in which the belts 202, 204, 206 and 208 are substantially flush with the belts 201, 203, 205 and 207 but lying at a level a little higher than the level of the second belt group. The starting position for the swing belts 221 and 224 of the second group is the down-position in which the belts 221 and 241 are inclined down toward a wafer centering table 280 as the result of their swing movement about the driving axes 231 and 232. FIG. 8A illustrates the starting positions of the belts.

After completing the above positioning, a wafer 100 is taken out from the wafer supply holder 120-1 by the operation of carrier 131 and moving member 130 in the manner as described above. When the wafer 100 is placed on the conveyor belt 201, it is detected by the sensor 261. In response to the wafer detection signal, the motor M1 starts rotating to drive the belts 201 and 202 thereby conveying the wafer 100 toward the belt 221. Although the belts 203 and 204 are also driven at the same time, they have no concern with the wafer 100 now being transported by the belts 201 and 202. When the wafer 100 is detected by the sensor 263, the motor M1 is stopped. At the same time, in response to the output signal from the sensor 263, motors M5 and M6 start rotating to swing the first belt group down and the second belt group up. The rotations of motors M5 and M6 are being monitored by the switches 271 and 272 which stop the motors at the completion of above swing-down and swing-up of the two belt groups. By this swing motion of the related belts the wafer 100 is transferred onto the belt 221 of the second group from the belt of the first group. FIG. 8B illustrates the positions of the belts after the transfer of the wafer 100.

When the swing belts of the first group reach the down-position, it is detected by switches 271 and 272. In response to the signals from the switches the motors M3 and M4 start rotating to transport the wafer 100 to the centering table 280 by the conveyor belts 221 and 222. The entrance of the wafer to the centering table is detected by the wafer sensor 265. To correctly position the wafer on the table, the output of the sensor may be obtained in the form of a pulse signal. For example, the pulse level of the output signal from the sensor is at low level before the wafer reaches the area of the sensor and after it has passed over the sensor. Only when the wafer is passing over the sensor, does the pulse level becomes high. The positional relation between the sensor 265 and the centering table 280 are preset in such a manner that when the pulse signal falls to low level from high level, the wafer reaches the center area of the centering table 280. When the fall of the pulse signal is detected, the motors M3 and M4 are stopped. At the same time, in synchronism with the fall-down of the pulse signal, the motors M5 and M6 are started to rotate thereby swinging the first belt group up and the second group down. By this swing motion of the belts the wafer 100 is placed on the centering table 280. In this position, operation of the conveyor system is provisionally stopped to operate.

After centering the wafer 100 on the centering table 280, the wafer is pushed up by a push rod 281 and then transferred onto a slider mechanism not shown. The slider mechanism transports the wafer 100 further to an exposure apparatus 300 in which the wafer is exposed to a light image of a selected circuit pattern. After exposure, the wafer is again transported to the centering table by the slider mechanism. At the time, that conveyor system is restarted to operate. After the restart, the wafer conveying system may be operated in the following alternative manner:

(1) At the restart of the system, the first belt group is in the up-position and the second group is in the down-position. The push rod 281 receives the wafer 100 from the slider mechanism and then the push rod 281 is lowered to place the wafer on the centering table 280. Thereafter, the position of the first belt group is switched over to the down-position and the second group to the up-position.

(2) Previously to the return of the wafer to the centering table 280, the position of the first belt group is switched over to the up-position and the second group to the down-position. After transferring the wafer onto the push rod 281 from the slider mechanism, the push rod is lowered to transfer the wafer onto the second belt group.

Either of the above two operational procedure may be selected.

When the wafer is transferred to the belts 222 and 223 of the second group, the motors M3 and M4 are started rotating to drive the belts 221-224 to convey the wafer toward the belt 206. When the wafer is detected by the sensor 266, the motors M3 and M4 are stopped. Instead, the motors M5 and M6 are started rotating to swing the first belt group up. Thereby the wafer is transferred onto the belt 206. At the swing-up of the first belt group, the motor M2 is started rotating to drive the belts 205 and 206. As a signal to start the motor M2, an output of logic AND of the detection of wafer by the sensor 266 and the detection of up-position of the first belt group may be used.

When the wafer is detected by the sensor 267, the motor M2 is stopped. In the manner previously described, the substrate carrier 131 receives the wafer from the belt 205 and carries it into a container in the wafer receiving holder 120-3. Thus, the wafer is contained in the container and one operation cycle is completed.

The operation cycle described above is repeated for all of wafers in the supply holder 120-1. The wafers are sequentially taken out from the holder 120-1, exposed by the exposure apparatus 300 and sent to the wafer receiving holder 120-3. After the completion of processing of all of the wafers from the supply holder 120-1, the wafers contained in the containers held within the next supply holder 120-2 are sequentially conveyed making use of the conveyor belts 203, 204 and 207, 208 this time in accordance with the same procedure of operations as the above.

While the invention has been particularly shown and described with reference to preferred embodiments thereof, it is to be understood that various changes and modifications may be made therein without departing from the spirit and scope of the invention.

According to the illustrated embodiment, a plurality of wafer supply or receiving holders are used alternatively, so operations for changing wafer supply or receiving holders can be effected speedly, thereby operating efficiency being improved remarkably.

We claim:
1. A container for containing therein a planar substrate, said container comprising:

(a) housing means provided with an opening which said substrate can pass through in the direction substantially parallel to the plane of said substrate, and with an inner space for receiving said substrate;
(b) door means attached to said housing means for closing said opening, said door means being movable to open said opening; and
(c) fixing means for fixing said substrate received in said inner space to said housing means, said fixing means including a contact member movable within said inner space of housing means, and means for moving said contact member and operable in link with the motion of said door means in such manner that when said opening is closed by said door means, said contact member is brought into contact with said substrate and when said opening is opened, said contact member is retracted from said substrate.

2. A substrate container according to claim 1, wherein said housing means includes first and second walls provided on both sides of said opening and arranged opposed to each other and wherein said first wall has means for supporting one surface of said substrate.

3. A substrate container according to claim 2, wherein said contact member is able to contact the other surface of said substrate.

4. A substrate container according to claim 3, wherein said fixing means further includes biasing means for pressing said contact member against said substrate in link with the motion of said door means to close said opening.

5. A substrate container according to claim 3, wherein said moving means includes biasing means for biasing said contact member in the direction toward said substrate in link with the motion of said door means to close said opening and for biasing said contact member in the direction away from said substrate in link with the motion of said door means to open said opening.

* * * * *

UNITED STATES PATENT AND TRADEMARK OFFICE
CERTIFICATE OF CORRECTION

PATENT NO. : 4,422,547
DATED : December 27, 1983
INVENTOR(S) : NOBUTOSHI ABE, ET AL.

It is certified that error appears in the above-identified patent and that said Letters Patent is hereby corrected as shown below:

On the title page
    Between item [22] and [51] insert Foreign Application Priority Data: --December 1, 1981[JP] Japan.......56-193491--

Column 1, line 13, delete "immovable".
Column 5, line 16, after "surface" insert --of--;
         line 21, delete "with".
Column 7, line 58, change "fall-down" to --fall--.
Column 8, line 4, after "At" change "the" to --that--.

Signed and Sealed this

Fifth Day of June 1984

[SEAL]

Attest:

GERALD J. MOSSINGHOFF

Attesting Officer

Commissioner of Patents and Trademark